(12) United States Patent
Scheuerer et al.

(10) Patent No.: US 8,419,957 B2
(45) Date of Patent: Apr. 16, 2013

(54) METHOD FOR PRODUCING A MICROMECHANICAL COMPONENT HAVING A FILLER LAYER AND A MASKING LAYER

(75) Inventors: Roland Scheuerer, Stuttgart (DE); Heribert Weber, Nuertingen (DE); Eckhard Graf, Gomaringen (DE)

(73) Assignee: Robert Bosch GmbH, Stuttgart (DE)

( * ) Notice: Subject to any disclaimer, the term of this patent is extended or adjusted under 35 U.S.C. 154(b) by 623 days.

(21) Appl. No.: 12/450,659

(22) PCT Filed: Apr. 8, 2008

(86) PCT No.: PCT/EP2008/054187
§ 371 (c)(1),
(2), (4) Date: Dec. 16, 2009

(87) PCT Pub. No.: WO2008/132024
PCT Pub. Date: Nov. 6, 2008

(65) Prior Publication Data
US 2010/0089868 A1    Apr. 15, 2010

(30) Foreign Application Priority Data
Apr. 26, 2007    (DE) .......................... 10 2007 019 647

(51) Int. Cl.
    *C03C 15/00*    (2006.01)
(52) U.S. Cl.
    USPC .................. 216/36; 216/33; 216/39; 216/88; 438/693

(58) Field of Classification Search .................... 216/13, 216/17, 18, 19, 20, 88, 33, 36, 39, 41; 438/692, 438/693
See application file for complete search history.

(56) References Cited

U.S. PATENT DOCUMENTS

| 6,500,748 | B2 * | 12/2002 | Anand | 438/612 |
|---|---|---|---|---|
| 6,898,851 | B2 * | 5/2005 | Nishioka et al. | 29/852 |
| 2002/0153478 | A1 * | 10/2002 | Hsin | 250/227.14 |
| 2005/0045973 | A1 * | 3/2005 | Fischer et al. | 257/414 |
| 2005/0098840 | A1 | 5/2005 | Fuertsch et al. | |
| 2007/0018761 | A1 * | 1/2007 | Yamanaka et al. | 335/78 |

FOREIGN PATENT DOCUMENTS

| DE | 2004 036 035 A1 | 7/2005 |
|---|---|---|
| DE | 10 2004 037 304 | 2/2006 |
| JP | 2003-529312 | 9/2003 |
| JP | 2004-106116 | 4/2004 |
| JP | 2004-223710 | 8/2004 |
| JP | 2004-532744 | 10/2004 |
| JP | 2005-161516 | 6/2005 |
| JP | 2005-262412 | 9/2005 |
| JP | 2006043847 | 2/2006 |
| JP | 2006-102876 | 4/2006 |
| JP | 2006-332582 | 12/2006 |
| WO | WO2005118463 | 12/2005 |
| WO | WO 2006/013119 | 2/2006 |

* cited by examiner

*Primary Examiner* — Lan Vinh
(74) *Attorney, Agent, or Firm* — Kenyon & Kenyon LLP

(57) ABSTRACT

A method for producing a micromechanical component is proposed, a trench structure being substantially completely filled up by a first filler layer, and a first mask layer being applied on the first filler layer, on which in turn a second filler layer and a second mask layer are applied. A micromechanical component is also proposed, the first filler layer filling up the trench structure of the micromechanical component and at the same time forming a movable sensor structure.

18 Claims, 5 Drawing Sheets

METHOD FOR PRODUCING A MICROMECHANICAL COMPONENT HAVING A FILLER LAYER AND A MASKING LAYER

BACKGROUND OF THE INVENTION

1. Field of the Invention

The present invention relates to a method for producing micromechanical components having trench structures commonly known from German Published Application DE 2004 036 035.

2. Description of Related Art

A disadvantage of the known micromechanical components, however, is that large trench structures in particular cannot as a rule be completely filled up, and moreover that in the case of a micromechanical component having movable sensor structures, cap wafers must be laboriously patterned so that the cap wafers are spaced away from the movable sensor structures.

SUMMARY OF THE INVENTION

The method according to the present invention in accordance with the main claim or with the features of the coordinated claims has, in contrast thereto, the advantage that even large trench structures can be substantially completely filled up in uncomplicated fashion by way of a first filler layer, and filler layers can simultaneously be used as a functional layer. By way of the functional layer, spacing elements can be formed to protect the movable sensor structures from contact with a cap wafer. For formation of the spacing elements, in the method for producing the micromechanical component a second filler layer is applied over the first filler layer having the first mask layer, and a second mask layer is applied over that. The first mask layer is thus "buried" under the second filler layer, with the result that, advantageously, in the context of an etching operation the first mask layer acts as a stop layer, so that the material (first filler layer and substrate material) located under the first mask layer is substantially not removed by the etching operation.

A third mask layer and a first insulating layer are preferably applied on the substrate material before application of the first filler layer. The functions of the third mask layer and of the first insulating layer are presented in FIGS. 1A to 1L.

The first and/or the second filler layer are preferably made of a material having a low electrical resistance. For example, an epitaxial polysilicon (epi-polysilicon) layer, which is deposited preferably in doped fashion on the substrate material, can be used as a first and/or a second filler layer.

The first filler layer and/or the second filler layer are preferably applied or put on in such a way that the filler layers substantially completely cover the first side of the substrate material. It is thus possible to produce sensor structures and/or spacing elements proceeding from the entire first side of the substrate material, and not in a manner limited only to subregions of the first side of the substrate material.

The first filler layer is preferably planarized, proceeding from the first side of the substrate material, before the first mask layer is applied. Planarization advantageously forms a plane surface of the first filler layer, with the result that the first mask layer can be applied on the first filler layer substantially in one plane, preferably parallel to the main extension direction of the substrate material.

The second filler layer is preferably planarized, proceeding from the first side of the substrate material, prior to application of the second mask layer. Here as well, a plane surface of the second filler layer is advantageously formed, with the result that the second mask layer as well can advantageously be applied onto the second filler layer substantially in one plane parallel to the main extension direction of the substrate material.

In a (next) etching step, further trench structures and/or a spacing element and/or a sensor structure are preferably formed. The sensor structure is merely a precursor to a freely movable sensor structure. A movable sensor structure can accordingly be formed from the sensor structure. The spacing element preferably encompasses both the first and the second filler layer, and has a height that by preference is greater than the height of the (preliminary) sensor structure and of the movable sensor structure formed later.

At least some of the sensor structures preferably become movable sensor structures by way of a further etching step, a previously applied first insulating layer preferably being removed for this purpose (see FIGS. 1A to 1I). An oxide layer is preferably used as the first insulating layer; the oxide layer can be removed, for example, by way of a gas phase etching step. The movable sensor structures are preferably formed from the first filler layer.

In contrast to the sensor structure and the movable sensor structure, the spacing element preferably encompasses both the first and the second filler layer. If one or both of the filler layers is monocrystalline or polycrystalline, the spacing element then also exhibits a monocrystalline and/or polycrystalline structure. The sensor structure and the movable sensor structure preferably encompass only the first filler layer, and by preference are configured in either monocrystalline or polycrystalline fashion. As mentioned in the previous paragraph, the sensor structure becomes a movable sensor structure, for example, by way of a further etching step, so that the term "preliminary sensor structure" can also be used.

A cap wafer is preferably connected to the spacing element and/or to monocrystalline or polycrystalline regions of the filler layers, for example by anodic bonding or seal-glass bonding. It is also preferred, however, if the cap wafer is connected to at least one (preliminary, non-movable) sensor structure and/or to monocrystalline or polycrystalline regions of the filler layers. If the micromechanical component does not have a spacing element, the sensor structures are therefore advantageously not only thought of as precursors of the movable sensor structures, but additionally serve to reduce cap deflection in the region of the movable sensor structures. In the case of a micromechanical component without a spacing element, care must be taken in the context of the connection between an unpatterned cap wafer and the sensor structure that the movable sensor structures are not blocked by the unpatterned cap wafer. This can be ensured by using a connecting layer, for example seal glass. The necessary spacing from the movable sensor structures can be ensured by way of the thickness of the seal-glass layer. Let it be clarified once again in this context that the sensor structure for connecting to the cap wafer is not a movable sensor structure, but instead a (preliminary) sensor structure that has not become a movable sensor structure as a result of a further etching step. A "cap wafer" is to be understood as all components that can be used to seal off at least subregions of a micromechanical component. The spacing element or sensor structure having, for example, seal-glass-bonded cap wafers advantageously makes it possible also to use unpatterned cap wafers, so that laborious patterning of the cap wafer is eliminated. Especially in the context of the use of a spacing element, laborious patterning of, for example, Pyrex cap wafers prior to anodic bonding is no longer necessary. It is of course also possible, however, to use patterned cap wafers or even cap wafers patterned only in subregions, the patterning of the cap wafer enabling, for example, electrical contacting of the micromechanical component.

The cap wafer and/or a second side of the substrate material is preferably planarized. In the context of planarization of the second side of the substrate material, a planarization extending into a plane of the trench structure is advantageously performed. Planarization of the cap wafer and/or of the second side of the substrate material advantageously makes the micromechanical component thinner. In addition, planarization of the second side of the substrate material extending into a plane of the trench structure advantageously makes possible back-side contacting of the micromechanical component.

A further subject of the present invention is a micromechanical component produced according to the method described. In the micromechanical component, the trench structure that is required for through-contacting of the micromechanical component is filled up substantially completely by the first filler layer, the first filler layer also serving to implement the movable sensor structures. Advantageously, when a conductive first filler layer is used, the first filler layer can on the one hand create a precondition for back-side contacting and on the other hand can form the movable sensor structures.

The cap wafer is preferably connected via anodic bonding or seal-glass bonding to the spacing element and/or to the monocrystalline or polycrystalline regions of the filler layers. The spacing element is constituted in this context by the first and the second filler layer, and has a greater height than the movable sensor structure or the sensor structure. As a result of the greater height as compared with the movable sensor structure, the cap wafer can advantageously be connected to the spacing element directly by anodic bonding, with no need to perform patterning of the cap wafer and no interference with the movable sensor structures as a result of contact with the cap wafer. The spacing element thus advantageously makes possible anodic bonding between the cap wafer and the micromechanical component without patterning the cap wafer.

The cap wafer is preferably connected by seal-glass bonding to the sensor structures and/or to the monocrystalline regions, which optionally can also be embodied in polycrystalline fashion. Here as well, the cap wafer advantageously does not need to be patterned, since the seal glass ensures spacing between the cap wafer and the movable sensor structures.

The micromechanical component preferably has a first insulating layer and/or a third insulating layer. The first insulating layer is preferably deposited on the first side of the substrate material, and preferably covers at least the walls and the floor of the trench structure. The third insulating layer is preferably deposited on the second side of the substrate material, after the second side of the substrate material has been planarized as far as a plane of the trench structure. The first insulating layer is preferably created by way of a LOCOS method. The third insulating layer, on the other hand, is preferably produced using a CVD deposition method.

The micromechanical component is preferably planarized proceeding from a first side of the substrate material and/or from a second side of the substrate material. Planarization advantageously makes the micromechanical component thinner so that it can be better incorporated even into flat assemblies.

The micromechanical component is preferably planarized, proceeding from the second side of the substrate material, as far as a plane of the trench structure. This advantageously make possible back-side contacting of the micromechanical component if a conductive material is used as the first filler layer.

The cap wafer that is in contact with the micromechanical component is preferably a Pyrex wafer or a silicon wafer or a composite of a Pyrex and a silicon wafer.

DETAILED DESCRIPTION OF THE INVENTION

Figure 1A:
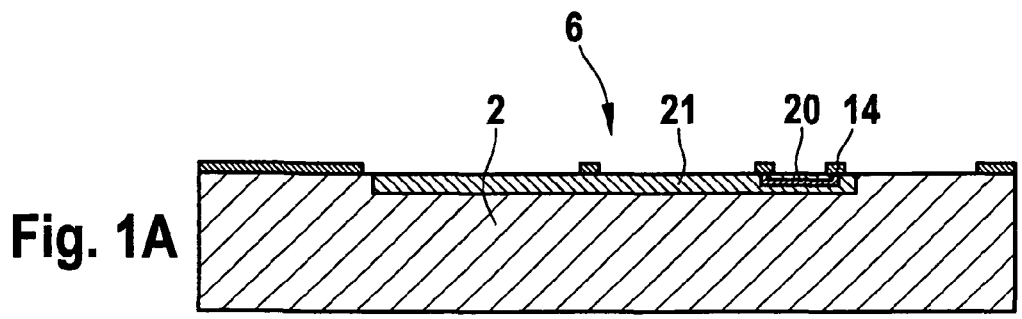
FIGS. 1A to 1T schematically depict a method for producing a micromechanical component.
Figure 1B:
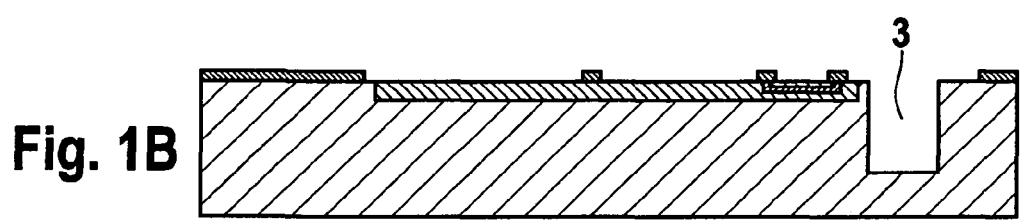
Figure 1C:
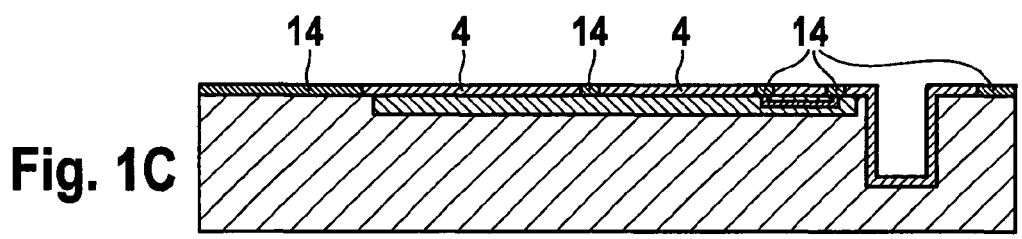
Figure 1D:
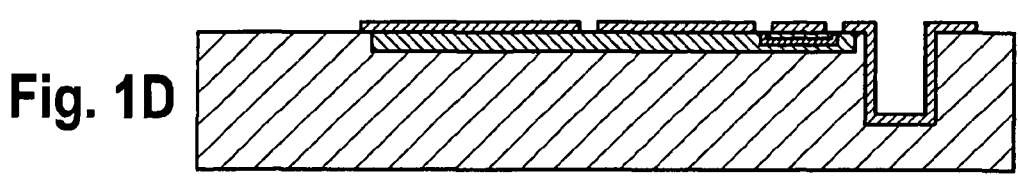
Figure 1E:
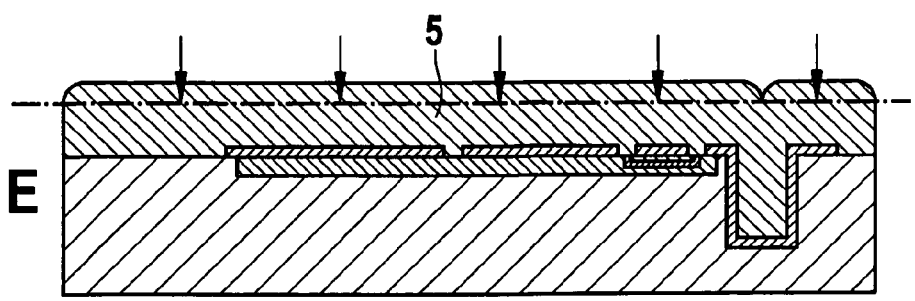
Figure 1F:
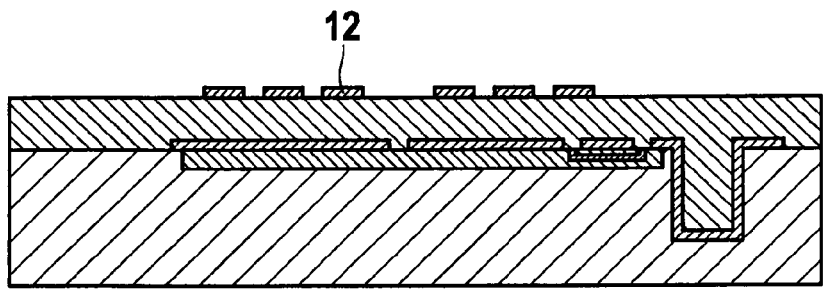
Figure 1G:
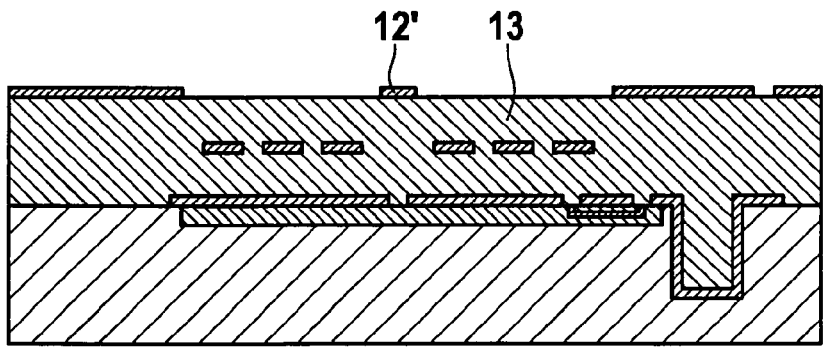
Figure 1H:
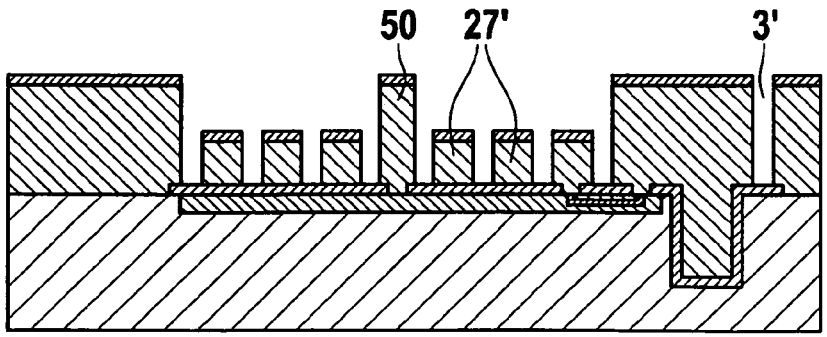
Figure 1I:
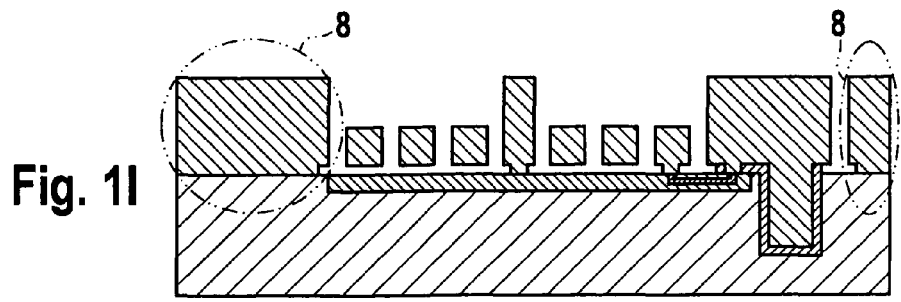
Figure 1J:
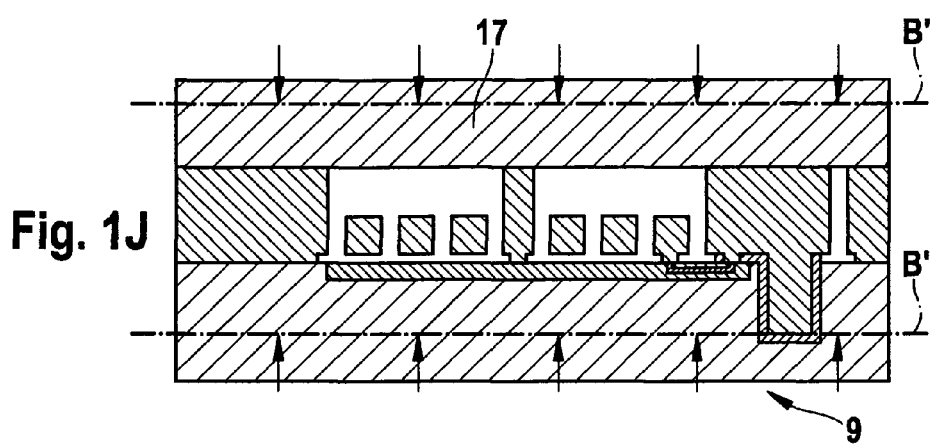
Figure 1K:
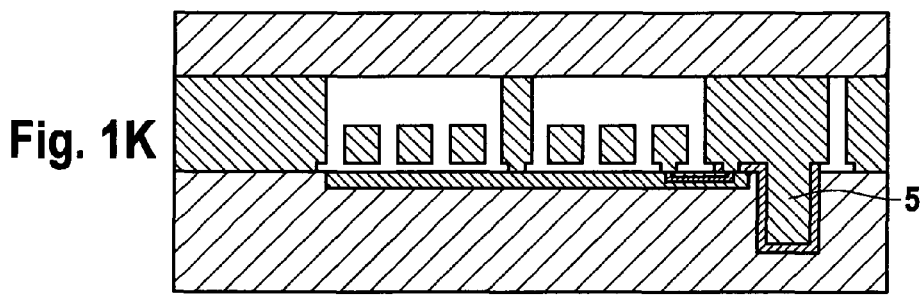
Figure 1L:
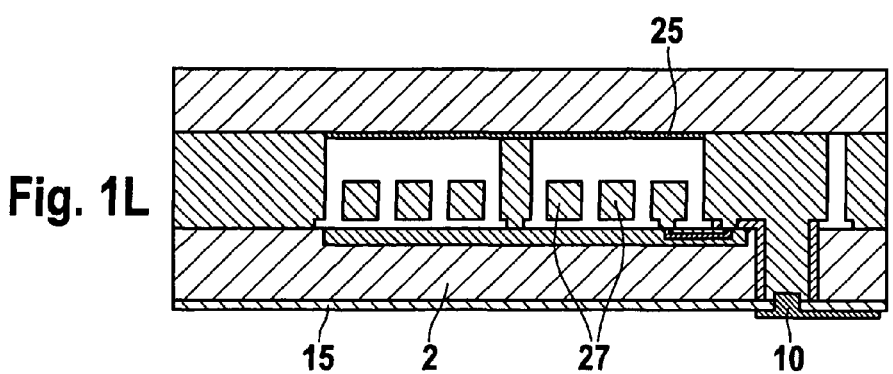
Figure 1M:
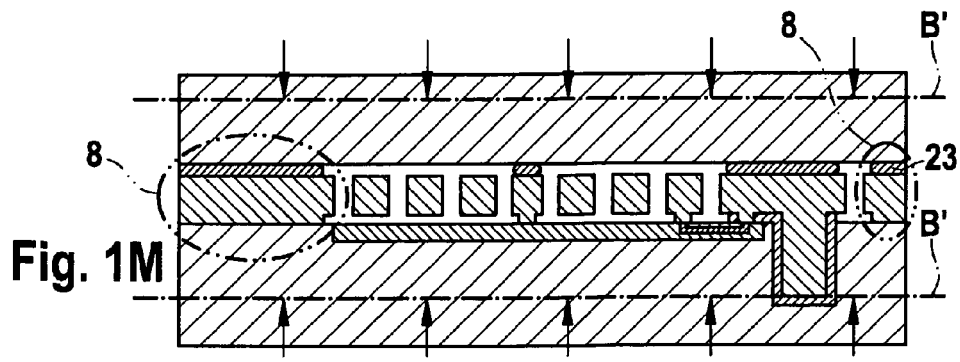
Figure 1N:
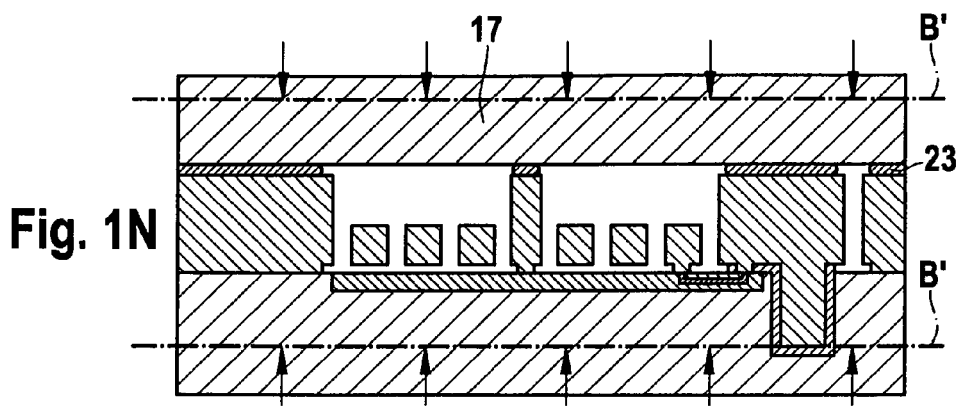
Figure 1O:
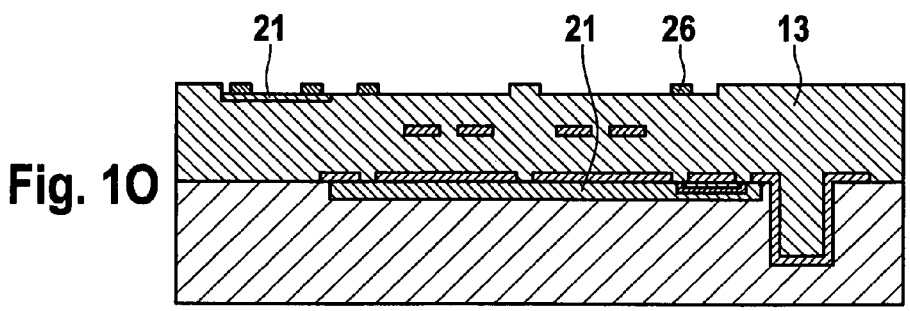
Figure 1P:
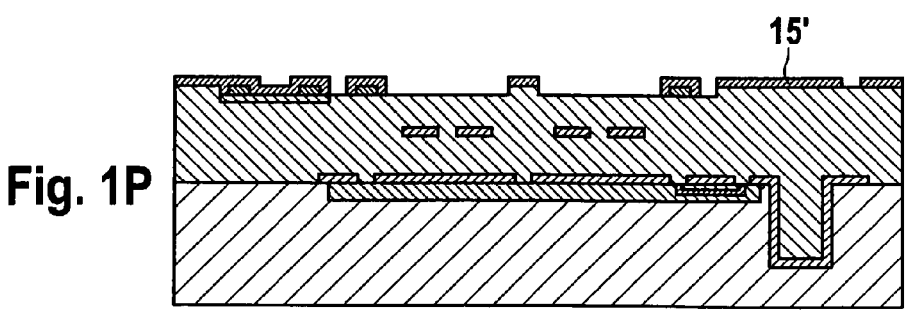
Figure 1Q:
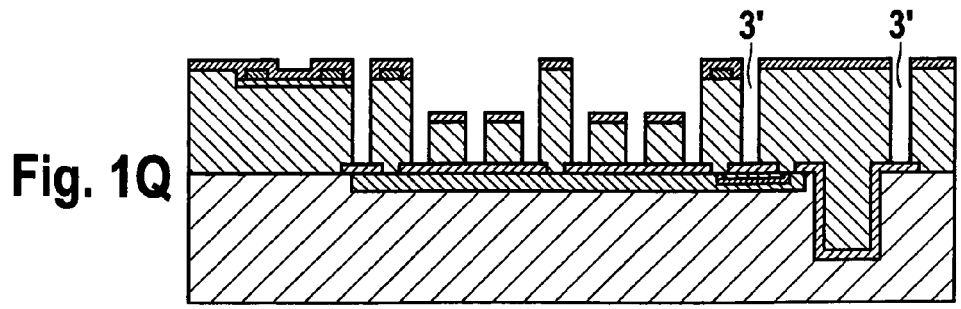
Figure 1R:
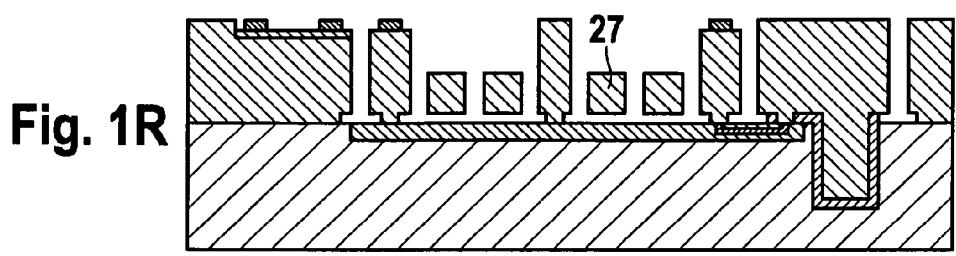
Figure 1S:
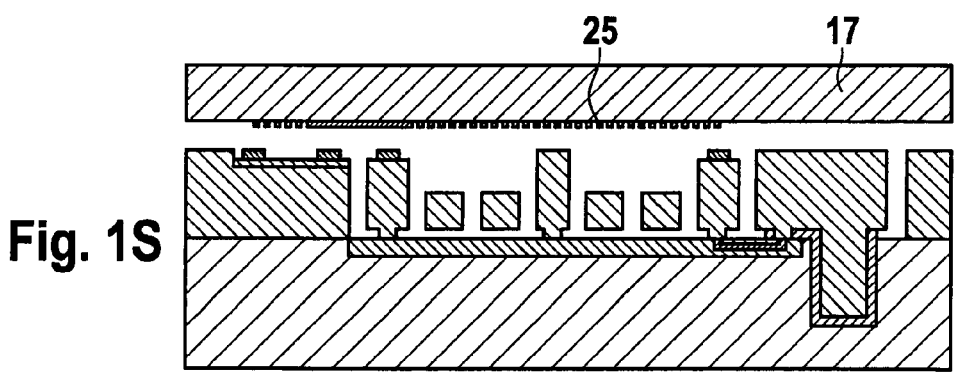
Figure 1T:
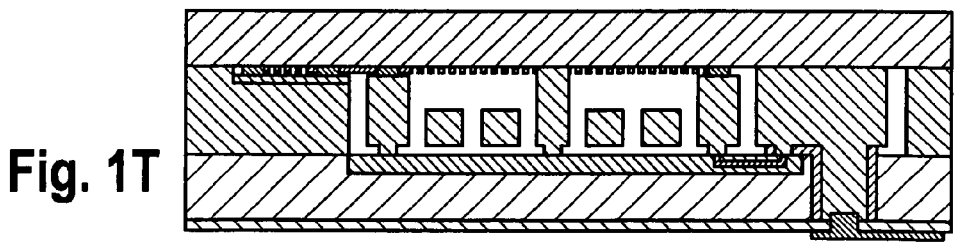

FIG. 1A schematically depicts a substrate material 2, for example silicon, having a circuit region 21 and a conductive path 20. A third mask layer 14, made e.g. of silicon nitride, is applied on a first side 6 of substrate material 2. FIG. 1B schematically depicts the manner in which a trench structure 3 was produced in substrate material 2. By way of a subsequent (e.g. LOCOS) process, a first insulating layer 4 is deposited on substrate material 2, the walls and floor of trench structure 3 being covered by first insulating layer 4 (FIG. 1C). The regions in which third mask layer 14 were applied remain free of third insulating layer 4, however. After the removal of third mask layer 14, for example by way of an etching step, gaps are created in first insulating layer 4 (FIG. 1D). Both these gaps and first trench structure 3 are filled up by a first filler layer 5 that is made, for example, of doped silicon (FIG. 1E); first filler layer 5 can grow in monocrystalline fashion into the gaps of insulating layer 4. First filler layer 5 is then preferably planarized, as indicated by the dashed line in FIG. 1E. After planarizing, a first mask layer 12, made e.g. of silicon oxide, is preferably applied on the thereby substantially plane surface of first filler layer 5 (FIG. 1F). FIG. 1G schematically depicts the manner in which a second filler layer 13, for example likewise made up of doped silicon, is applied over first mask layer 12 and first filler layer 5. A second mask layer 12', for example silicon oxide or photoresist, is then applied on second filler layer 13. Second filler layer 13 is preferably planarized before the application of second mask layer 12'. First mask layer 12 is thus buried under second filler layer 13. After an etching step, the result of the buried first mask layer 12 and second mask layer 12' is preferably to create both a sensor structure 27' and a spacing element 50 (FIG. 1H). Spacing element 50 is preferably formed from the first and the second filler layer 5, 13, and has a height that is greater than the height of sensor structure 27'. Further trench structures 3' are preferably also formed in the context of the etching step just mentioned. Subregions of first insulating layer 4 are then preferably removed by a further etching step, first insulating layer 4 being protected in the region of trench structure 3 by the first and the second filler layer 5, 13, and not being removed. The removal of first insulating layer 4 creates movable sensor structures 27 from at least some sensor structures 27', as depicted in FIG. 1I. As a result of the application of first filler layer 5 and second filler layer 13 directly onto substrate material 2, it is furthermore advantageously possible to form regions 8 of, for example, monocrystalline silicon if first filler layer 5 and second filler layer 13 are constructed by the deposition of epi-polysilicon. After the second planarizing step, regions 8 then preferably have the same height as a spacing element 50. Regions 8 can, of course, also be made of polycrystalline silicon. FIG. 1J depicts a cap wafer 17 connected to spacing element 50 by anodic bonding. Movable sensor structures 27 do not come into contact with cap wafer 17 even if cap wafer 17 is unpatterned, since spacing element 50 and regions 8 have a height that is greater than the height of movable sensor structures 27. In the exemplifying embodiment, cap wafer 17 rests both on spacing element 50 and on regions 8. It is preferable to planarize cap wafer 17 proceeding from first side 6 of substrate material 2, and to planarize substrate material 2 proceeding from a second side 9 of substrate material 2. The planes to which planarization is to occur are indicated as B', such that plane B' of second side 9 of substrate material 2 extends into a plane of trench structure 3. This advantageously makes possible back-side contacting of the completed micromechanical component 1. FIG. 1K schematically depicts an embodiment of micromechanical component 1. FIG. 1L schematically depicts another embodiment of micromechanical component 1, in which cap wafer 17 has an add-on layer 25, and a third insulating layer 15 was produced on second side 9 of substrate material 2. Add-on layer 25 can be, for example, an insulator, but also an electrically conductive layer that optionally can be electrically contacted. An additional layer 10 is in contact with first filler layer 5 in trench structure 3. Additional layer 10 is preferably an aluminum metallization. Also conceivable is a metallization that enables a flip-chip connection to other components. FIG. 1M schematically depicts an embodiment of a micromechanical component 1 to be produced without spacing element 50. In this case, cap wafer 17 is connected via a connecting layer 23 to sensor structure 27' and to regions 8; connecting layer 23 can be made, for example of seal glass. In this case as well, movable sensor structures 27 do not come into contact with the unpatterned cap wafer 17. FIG. 1N depicts an embodiment of a micromechanical component 1 having a spacing element 50 and connecting layer 23. FIGS. 1O to 1T depict an embodiment having contact pads 26, contact pads 26 being applied on second filler layer 13 and being covered by a second insulating layer 15. In combination with add-on layer 25, a contact to cap wafer 17 is produced. In another alternative (not depicted), in principle no back-side contacting of the above-described micromechanical component 1 is necessary. It is likewise conceivable for cap wafer 17 to be patterned, for example, in the region of bonding pads in order to enable electrical contacting of micromechanical component 1 from first side 6. In this case, however, cap wafer 17 need not be patterned in the region of movable sensor structures 27, since connecting layer 23 (e.g. seal glass) ensures spacing between cap wafer 17 and movable sensor structures 27. The partial patterning of cap wafer 17 just mentioned can be implemented both for cap wafers that are mounted on non-movable sensor structures 17 and for cap wafers that are mounted on spacing elements 50.

What is claimed is:

1. A method for producing a micromechanical component comprising:
    generating a trench structure in a substrate material proceeding from a first side, wherein the trench structure is substantially completely filled up by a first filler layer,
    applying a first mask layer onto the first filler layer,
    applying a second filler layer over the first mask layer, and applying a second mask layer over the second filler layer,
    wherein the micromechanical component is planarized from a second side of the substrate material as far as a plane of the trench structure.

2. The method for producing a micromechanical component as recited in claim 1, wherein before the first filler layer, a third mask layer and a first insulating layer are applied on the substrate material.

3. The method for producing a micromechanical component as recited in claim 1, wherein at least one of the first filler layer and the second filler layer are applied so as to cover the first side of the substrate material substantially completely.

4. The method for producing a micromechanical component as recited in claim 1, wherein the first filler layer is planarized, proceeding from the first side of the substrate material, before the first mask layer is applied.

5. The method for producing a micromechanical component as recited in claim 1, wherein the second filler layer is planarized, proceeding from the first side of the substrate material, prior to application of the second mask layer.

6. The method for producing a micromechanical component as recited in claim 1, wherein in an etching step, at least one of a further trench structure, a spacing element and sensor structures are formed.

7. The method for producing a micromechanical component as recited in claim 6, wherein movable sensor structures are formed at least in part from the sensor structures by way of a further etching step, the movable sensor structures in the micromechanical component being formed from the first filler layer.

8. The method for producing a micromechanical component as recited in claim 6, wherein a cap wafer is connected by anodic bonding or seal-glass bonding to a spacing element or to monocrystalline or polycrystalline regions, or a cap wafer is connected by seal-glass bonding to the sensor structure or to the monocrystalline or polycrystalline regions.

9. A micromechanical component produced according to the method of claim 7, wherein the trench structure is filled up substantially completely by the first filler layer, the first filler layer constituting the movable sensor structures and the sensor structures.

10. The micromechanical component as recited in claim 9, wherein a cap wafer is connected by seal-glass bonding to the sensor structures or to the monocrystalline or polycrystalline regions.

11. The micromechanical component as recited in claim 9, wherein the micromechanical component has at least one of a first insulating layer and a third insulating layer.

12. The micromechanical component as recited in claim 9, wherein the micromechanical component is planarized proceeding from a first side of the substrate material or from a second side of the substrate material.

13. The micromechanical component as recited in claim 9, wherein a cap wafer is connected via anodic bonding or seal-glass bonding to the spacing element or to monocrystalline or polycrystalline regions.

14. The micromechanical component as recited in claim 13, wherein the cap wafer encompasses a composite of a Pyrex® wafer and a silicon wafer.

15. The micromechanical component as recited in claim 13, wherein the cap water is made up of a Pyrex® wafer.

16. The micromechanical component as recited in claim 13, wherein the cap wafer is made up of a silicon wafer.

17. A method for producing a micromechanical component comprising:
    generating a trench structure in a substrate material proceeding from a first side, wherein the trench structure is substantially completely filled up by a first filler layer,
    applying a first mask layer onto the first filler layer,
    applying a second filler layer over the first mask layer, and applying a second mask layer over the second filler layer,
    wherein in an etching step, at least one of a further trench structure, a spacing element and sensor structures are formed,
    wherein a cap wafer is connected by anodic bonding or seal-glass bonding to a spacing element or to monocrystalline or polycrystalline regions, or a cap wafer is connected by seal-glass bonding to the sensor structure or to the monocrystalline or polycrystalline regions, wherein at least one of the cap wafer and a second side of the substrate material are planarized, the planarization of the second side of the substrate material being performed as far as a plane of the trench structure.

18. A micromechanical component produced according to a method comprising:

generating a trench structure in a substrate material proceeding from a first side, wherein the trench structure is substantially completely filled up by a first filler layer, applying a first mask layer onto the first filler layer, applying a second filler layer over the first mask layer, and applying a second mask layer over the second filler layer, wherein in an etching step, at least one of a further trench structure, a spacing element and sensor structures are formed, wherein movable sensor structures are formed at least in part from the sensor structures by way of a further etching step, the movable sensor structures in the micromechanical component being formed from the first filler layer, wherein the trench structure is filled up substantially completely by the first filler layer, the first filler layer constituting the movable sensor structures and the sensor structures, wherein the micromechanical component is planarized from a second side of the substrate material as far as a plane of the trench structure.

\* \* \* \* \*

UNITED STATES PATENT AND TRADEMARK OFFICE
CERTIFICATE OF CORRECTION

PATENT NO. : 8,419,957 B2  Page 1 of 1
APPLICATION NO. : 12/450659
DATED : April 16, 2013
INVENTOR(S) : Scheuerer et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 675 days.

Signed and Sealed this
First Day of September, 2015

Michelle K. Lee
*Director of the United States Patent and Trademark Office*